(12) United States Patent
Holland et al.

(10) Patent No.: US 11,371,323 B2
(45) Date of Patent: Jun. 28, 2022

(54) NEAR WELLBORE DISCRETE FRACTURE NETWORKS

(71) Applicants: Marc Holland, The Hague (NL); Wouter Van Der Zee, Voorburg (NL)

(72) Inventors: Marc Holland, The Hague (NL); Wouter Van Der Zee, Voorburg (NL)

(73) Assignee: BAKER HUGHES, A GE COMPANY, LLC, Houston, TX (US)

( * ) Notice: Subject to any disclaimer, the term of this patent is extended or adjusted under 35 U.S.C. 154(b) by 840 days.

(21) Appl. No.: 15/870,285

(22) Filed: Jan. 12, 2018

(65) Prior Publication Data

US 2018/0202266 A1  Jul. 19, 2018

Related U.S. Application Data

(60) Provisional application No. 62/446,056, filed on Jan. 13, 2017.

(51) Int. Cl.
*E21B 49/00* (2006.01)
*E21B 41/00* (2006.01)
(Continued)

(52) U.S. Cl.
CPC .......... *E21B 41/0092* (2013.01); *E21B 43/26* (2013.01); *E21B 47/002* (2020.05);
(Continued)

(58) Field of Classification Search
CPC .... E21B 41/0092; E21B 47/002; E21B 43/26; E21B 49/00; E21B 7/04; E21B 43/11; E21B 47/18; G06F 30/20
(Continued)

(56) References Cited

U.S. PATENT DOCUMENTS

2009/0005996 A1 * 1/2009 Delorme ................ E21B 43/00
  702/12
2010/0250216 A1 * 9/2010 Narr .................... E21B 49/00
  703/10

(Continued)

FOREIGN PATENT DOCUMENTS

WO  WO-2016122792 A1 *  8/2016  ............. G01V 1/288
WO  WO-2017066718 A1 *  4/2017  ............... C09K 8/60

OTHER PUBLICATIONS

Bourbiaux, B.; "Fractured Reservoir Simulation: a Challenging and Rewarding Issue"; Oil & Gas Science and Technology-Rev, IFP; vol. 65, No. 2; 2010; Institut Franais du petrole; 12 pages.
Bourbiaux, et al.; "Fractured Reservoirs Modelling: a Review of the Challenges and Some Recent Solutions"; First Break, vol. 23; Sep. 2005; EAGE; 12 pages.

(Continued)

*Primary Examiner* — Chuen-Meei Gan
(74) *Attorney, Agent, or Firm* — Cantor Colburn LLP

(57) ABSTRACT

A method for performing a physical operation on a geologic formation includes: receiving image data of the formation obtained by an imaging tool disposed in a borehole penetrating the formation, the image data having images of fractures intersecting a wall of the borehole to provide borehole fracture data; simulating multiple fracture scenarios of the fractures intersecting the wall of the borehole with each scenario based on keeping the borehole fracture data constant to provide a plurality of simulations, each fracture scenario varying at least one of fracture dimensions, fracture shape, and fracture placement with respect to the borehole; determining a property from each simulation; calculating the property for the plurality of simulations at a selected statistical level, wherein the receiving, simulating, determining, and calculating are performed using a processor; and performing the physical operation on the geologic formation using physical operation apparatus based on the calculated property.

20 Claims, 12 Drawing Sheets

REALIZATION 1
FRACTURE SET A FIRST, SET B SECOND

(51) Int. Cl.
    *E21B 43/26*    (2006.01)
    *G06F 30/20*    (2020.01)
    *E21B 47/002*   (2012.01)
    *E21B 47/18*    (2012.01)
    *E21B 43/11*    (2006.01)
    *E21B 7/04*     (2006.01)

(52) U.S. Cl.
    CPC .............. *E21B 49/00* (2013.01); *G06F 30/20*
              (2020.01); *E21B 7/04* (2013.01); *E21B 43/11*
                        (2013.01); *E21B 47/18* (2013.01)

(58) Field of Classification Search
    USPC .......................................................... 703/10
    See application file for complete search history.

(56)              References Cited

U.S. PATENT DOCUMENTS

2012/0310613 A1*  12/2012  Moos .................... G01V 11/00
                                                        703/10
2016/0003019 A1*   1/2016  Safariforoshani ...... E21B 43/26
                                                        703/10
2016/0090823 A1*   3/2016  Alzahabi ................. E21B 43/30
                                                         703/2

OTHER PUBLICATIONS

Paui, et al.; "Fluid Flow in a Fractured Reservoir Using a Geomechanically Constrained Fault-Zone-Damage Model for Reservoir Simulation"; Aug. 2009; SPE Reservoir Evaluation & Engineering; Society of Petroleum Engineers; 14 pages.

* cited by examiner

1) IDENTIFY MAX APPARENT HEIGHT

2) USE ASPECT RATIO TO DETERMINE LATERAL DIMENSION

3) DO MULTIPLE REALIZATIONS FOR PLACEMENT (CAN USE DIFFERENT SIZES WITHIN BOUNDARY LIMITS)

REALIZATION 1
FRACTURE SET A FIRST, SET B SECOND

REALIZATION 2
FRACTURE SET A FIRST, SET B SECOND

REALIZATION 1
FRACTURE SET B FIRST, SET A SECOND

REALIZATION 2
FRACTURE SET B FIRST, SET A SECOND

REALIZATION n

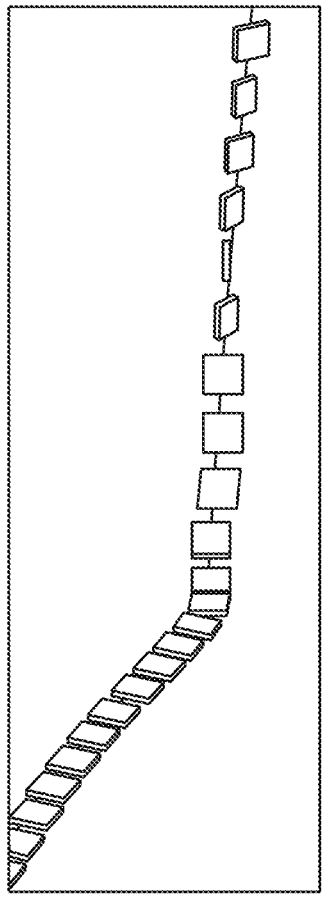 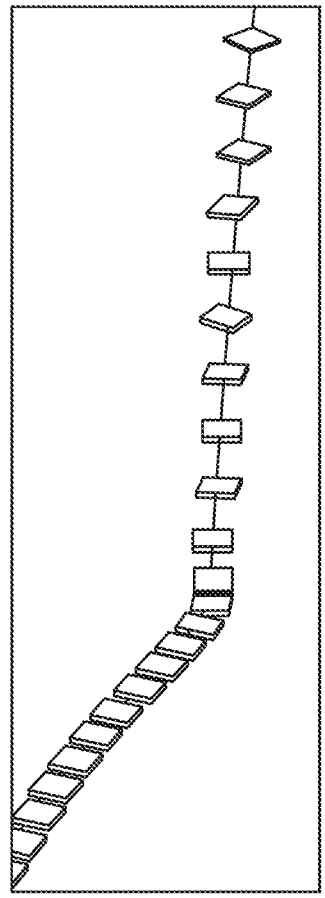 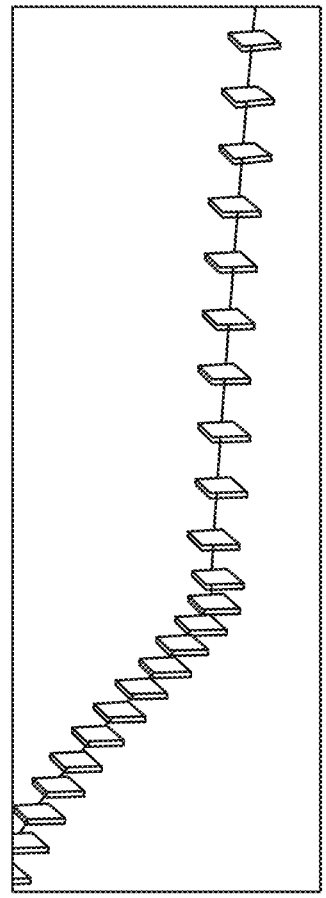
TYPE 0 - AZIMUTH AND DIP FROM WELL TRAJECTORY
TYPE 1 - AZIMUTH FROM WELL TRAJECTORY, HORIZONTAL
TYPE 2 - HORIZONTAL AND ALIGNED NORTH
FIG. 12A
FIG. 12B
FIG. 12C

NEAR WELLBORE DISCRETE FRACTURE NETWORKS

CROSS REFERENCE TO RELATED APPLICATIONS

This application claims the benefit of an earlier filing date from U.S. Provisional Application Ser. No. 62/446,056 filed Jan. 13, 2017, the entire disclosure of which is incorporated herein by reference.

BACKGROUND

In general, hydrocarbons may be produced by geologic formations having permeable fractures that contribute to the overall permeability of the formations. These fractures may be naturally occurring or produced by stimulation and may be modeled by a field-wide discrete fracture network. Field-wide discrete fracture networks, however, typically model a whole or mostly whole reservoir and can involve uncertainties and assumptions, which often reduce the accuracy in modelling fractures. The uncertainties can be too high and the assumptions too risky when providing fracture permeability data in the direct proximity of the wellbore or to a reservoir simulator. Due to these uncertainties, the parameters of the reservoir simulation are commonly changed rather than going back to the fracture network model. Typically, this makes the value of the field-wide fracture network model in the wellbore proximity questionable. Hence, it would be well received in the hydrocarbon production industry if the accuracy of fracture network models could be improved.

SUMMARY

Disclosed is a method for performing a physical operation on a geologic formation. The method includes: receiving image data of the formation obtained by an imaging tool disposed in a borehole penetrating the formation, the image data having images of fractures intersecting a wall of the borehole to provide borehole fracture data; simulating multiple fracture scenarios of the fractures intersecting the wall of the borehole with each scenario based on keeping the borehole fracture data constant to provide a plurality of simulations, each fracture scenario varying at least one of fracture dimensions, fracture shape, and fracture placement with respect to the borehole; determining a property from each simulation; calculating the property for the plurality of simulations at a selected statistical level, wherein the receiving, simulating, determining, and calculating are performed using a processor; and performing the physical operation on the geologic formation using physical operation apparatus based on the calculated property.

Also disclosed is a method for drilling a first borehole in a geologic formation. The method includes: receiving image data of the formation obtained by an imaging tool disposed in a second borehole penetrating the formation, the image data having images of fractures intersecting a wall of the borehole to provide borehole fracture data; simulating multiple fracture scenarios of the fractures intersecting the wall of the second borehole with each scenario based on keeping the borehole fracture data constant to provide a plurality of simulations, each fracture scenario varying at least one of fracture dimensions, fracture shape, and fracture placement with respect to the borehole; determining a directional permeability as a function of depth from each simulation; calculating the directional permeability as a function of depth for the plurality of simulations at a selected statistical level, wherein the receiving, simulating, determining, and calculating are performed using a processor; and drilling the first borehole according to a selected trajectory based on the calculated directional permeability as a function of depth, wherein a value of the directional permeability at a selected depth interval meets or exceeds a threshold value.

Further disclosed is a method for hydraulically fracturing a geologic formation. The method includes: receiving image data of the formation obtained by an imaging tool disposed in a borehole penetrating the formation, the image data having images of fractures intersecting a wall of the borehole to provide borehole fracture data; simulating multiple fracture scenarios of the fractures intersecting the wall of the borehole with each scenario based on keeping the borehole fracture data constant to provide a plurality of simulations, each fracture scenario varying at least one of fracture dimensions, fracture shape, and fracture placement with respect to the borehole; determining a permeability as a function of depth from each simulation; calculating the permeability as a function of depth for the plurality of simulations at a selected statistical level, wherein the receiving, simulating, determining, and calculating are performed using a processor; and hydraulically fracturing the formation in a selected depth interval based on the calculated permeability as a function of depth, wherein a value of the permeability as a function of depth is less than a threshold value.

BRIEF DESCRIPTION OF THE DRAWINGS

The following descriptions should not be considered limiting in any way. With reference to the accompanying drawings, like elements are numbered alike:

FIG. 1.1 depicts aspects of analyzing a fracture realization using a sliding analysis volume, here illustrated in two-dimensions (2D) by a box; and FIGS. 12A-12C, collectively referred to as FIG. 12, depicts possible orientations of the sliding analysis volume, which for purposes of clarity does not show analysis volumes overlapping.

DETAILED DESCRIPTION

A detailed description of one or more embodiments of the disclosed apparatus and method are presented herein by way of exemplification and not limitation with reference to the Figures.

Disclosed are methods for obtaining a near-wellbore fracture network for a reservoir. In one or more embodiments, the term "near-wellbore" relates to the modelling fractures within a 30 meter radius of the wellbore. The near-wellbore fracture network provides increased accuracy of fracture modelling over a conventional discrete fracture network that relies on many assumptions and stochastic placement of borehole fractures, which is only indirectly related to the borehole data. To be clear, in the conventional discrete fracture network the placement of fractures is based entirely on stochastic methods. On the other hand, fractures in the near-wellbore fracture network are modeled based on "hard" data obtained from borehole or wellbore images obtained by a downhole imaging tool conveyed through a borehole or wellbore penetrating the reservoir. That is, features of fractures observed in the images are modeled precisely as they are observed. Unseen features of observed fractures such as length, width, and placement with respect to the borehole are varied according to a Monte Carlo simulation to determine characteristics of the fractures surrounding the wellbore at various statistical levels. Characteristics may include fracture area per volume surrounding the borehole and directional permeability for volumes surrounding the borehole. With this type of information, different types of physical operations can be performed on the reservoir so that production resources can be efficiently utilized. For example, a well can be drilled horizontally in a zone that has high permeability as opposed to other zones that have lower permeability. As another example, a casing lining a wellbore can be perforated in zones having high permeability. Yet in another example, the reservoir can be fractured hydraulically in zones needing increased permeability. By having a near-well fracture network with increased accuracy, the accuracy of the physical operation can be increased resulting in an increase in hydrocarbon production.

Figure 1:
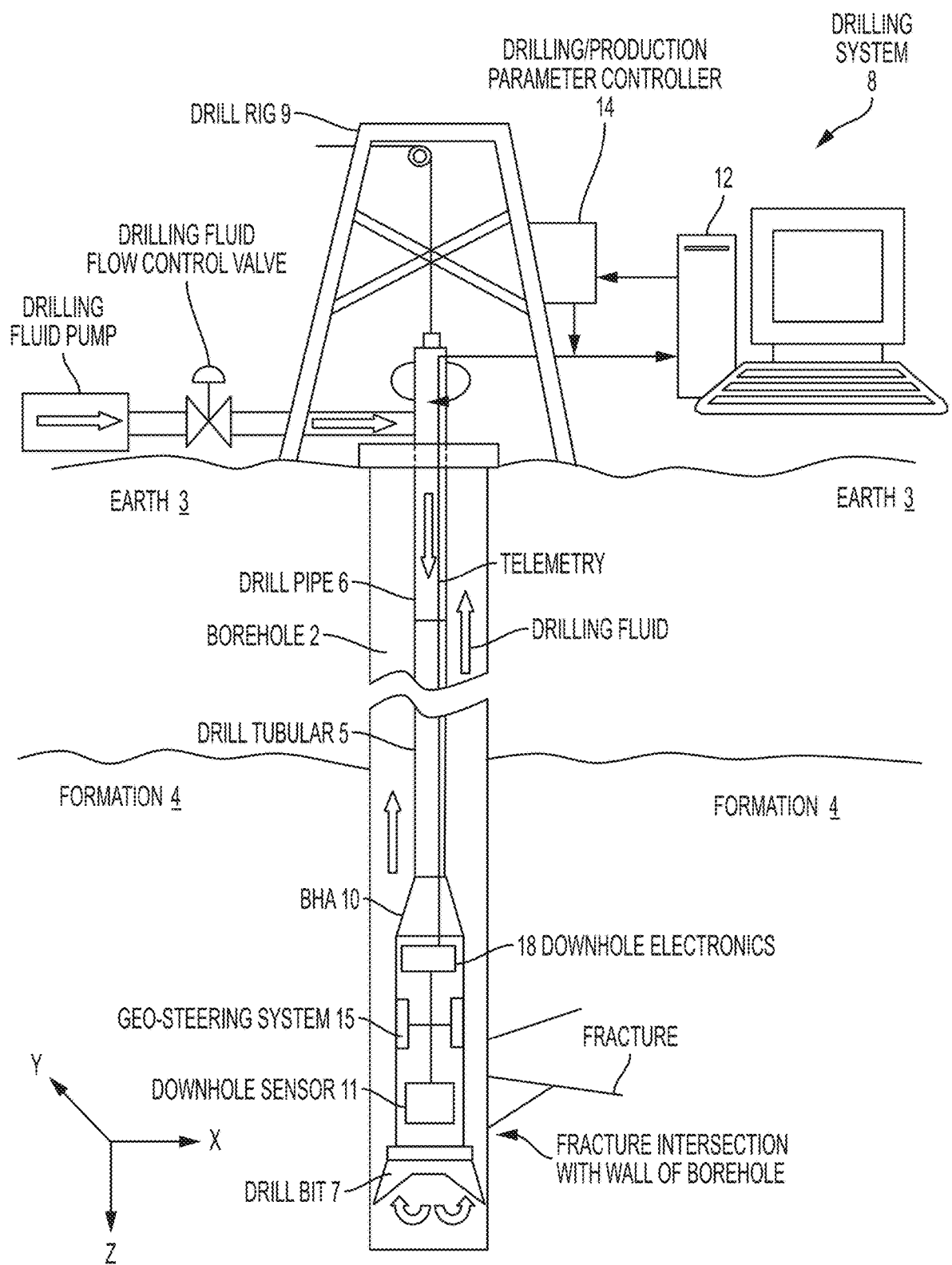
FIG. 1 illustrates a cross-sectional view of a drilling system for drilling a borehole penetrating a geologic formation.

Apparatus for implementing the disclosure and features related to the disclosure is now discussed. FIG. 1 illustrates a cross-sectional view of drilling apparatus used for implementing the methods disclosed herein. Apparatus for implementing the disclosure and features related to the disclosure is now discussed. FIG. 1 is a cross-sectional view of a borehole 2 (may also be referred to as a wellbore) penetrating the earth 3, which includes a formation 4. The formation 4 includes formation rock that has faults or fractures, some of which intersect a wall of the borehole 2.

A drilling system 8 includes a drill rig 9 that is configured to drill the borehole 2. A drill bit 7 is disposed at the distal end of a drill tubular 5 for drilling the borehole 2. The drill tubular 5 may be a drill string made up of a plurality of connected drill pipes 6. Drilling fluid or mud is pumped through the drill tubular 5 to lubricate the drill bit 7 and flush cuttings from the borehole 2. The drilling fluid is pumped by a drilling fluid pump and a flow rate of the drill fluid is controlled by a drilling fluid control valve. The drilling fluid pump and flow control valve may be controlled by a drilling parameter controller 14 to maintain a suitable pressure and flow rate to prevent the borehole 2 from collapsing. Suitable drilling fluid pressure and flow parameters may be determined by knowing the stresses of the formation rock, which can be determined from knowledge of fracture surrounding the wellbore 2. The drilling parameter controller 14 is configured to control, such as by feedback control for example, parameters used to drill the borehole. The drill tubular 5 includes a bottomhole assembly (BHA) 10. The BHA 10 includes a downhole sensor 11 configured to sense various downhole properties or parameters to provide image data that can be used to image a wall of the borehole 2. The image data includes images of fractures that intersect with the wall of the borehole 2. Non-limiting embodiments of the downhole sensor 11 include an electrical resistivity or conductivity sensor and an acoustic sensor. Different downhole sensors may be used individually or in combination. Sensor data may be transmitted to the surface by telemetry for processing such as by the computer processing system 12. The BHA 10 may also include a geo-steering system 15. The geo-steering system 15 is configured to steer the drill bit 7 in order to drill the borehole 2 according to a selected trajectory, path or geometry. The trajectory, path or geometry in general is selected to optimize hydrocarbon production from the borehole 2 and to ensure that the stress on the formation due to the borehole along the path does not exceed the strength of the formation material. In one or more embodiments, the trajectory is selected to place the wellbore in a formation volume having a maximum permeability or within a selected range of the maximum permeability. Steeling commands may be transmitted from the drilling parameter controller 14 to the geo-steering system 15 by the telemetry. Telemetry in one or more embodiments may include mud-pulse telemetry or wired drill pipe. Downhole electronics 18 may process data downhole and/or act as an interface with the telemetry.

Figure 2:
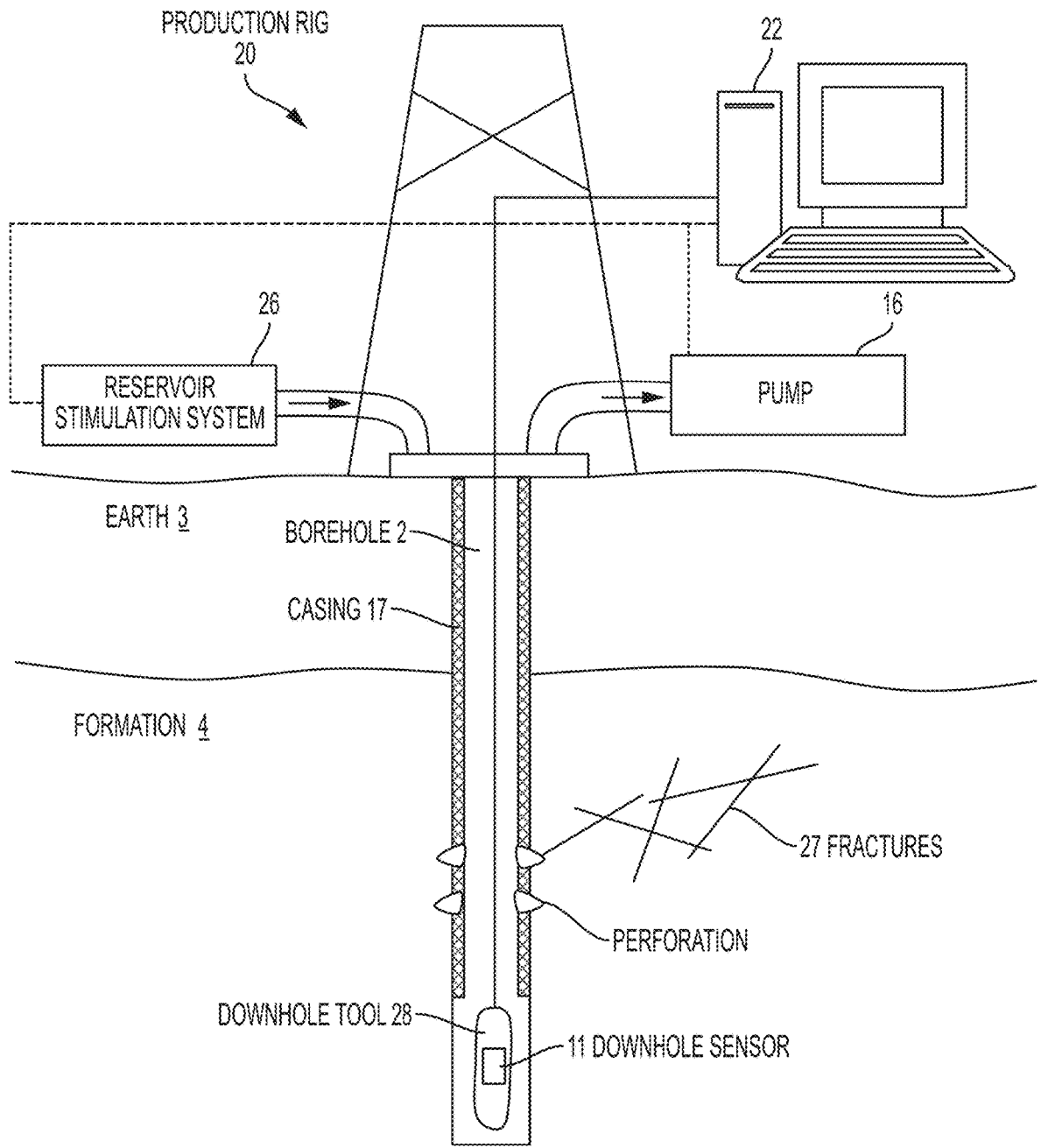
FIG. 2 illustrates a cross-sectional view of a production system for producing hydrocarbons from the formation.

In that further actions are contemplated after the near-wellbore fracture network is obtained, production equipment for implementing those actions is now discussed. FIG. 2 depicts aspects of production equipment for producing hydrocarbons from the earth formation 4 in a cross-sectional view. A production rig 20 is configured to perform actions related to the production of hydrocarbons from a reservoir in the formation 4 via the borehole 2. For example, the production rig 20 may include a pump 16 configured to pump hydrocarbons entering the borehole 2 to the surface at a selected flow rate based on the permeability of the formation 4. The borehole 2 may be lined by a casing 17 to prevent the borehole 2 from collapsing. The production rig 20 may include a formation or reservoir stimulation system 26 configured to stimulate the earth formation 4 to increase the flow of hydrocarbons. In one or more embodiments, the reservoir stimulation system 26 is configured to hydraulically fracture rock in the formation 4. In one or more embodiments, the formation 4 is fractured in zones or depth intervals that have low permeability or permeability that is below a selected permeability threshold value.

The production rig 20 may also be configured to image the wall of the borehole 2 and thus fractures intersecting the wall using the downhole sensor 11. The downhole sensor 11 may be included in a downhole tool 28, which may be conveyed through the borehole 2 by a carrier such as an armored wireline that also provides communications to the surface. In another embodiment, the downhole tool 28 may be configured to perforate the casing 17 at selected locations to provide perforations that enable communication of formation fluids with the borehole 2 for extraction. In one or more embodiments, a depth or depth interval for perforation is selected based on the permeability of the formation at that depth or depth interval being at or above a threshold permeability value.

FIG. 2 also illustrates a computer processing system 22. The computer processing system 22 is configured to implement the methods disclosed herein. Further, the computer processing system 22 may be configured to act as a controller for controlling operations of the production rig 20 to include well image logging, downhole tool operation and/or formation stimulation operation.

Figure 3:
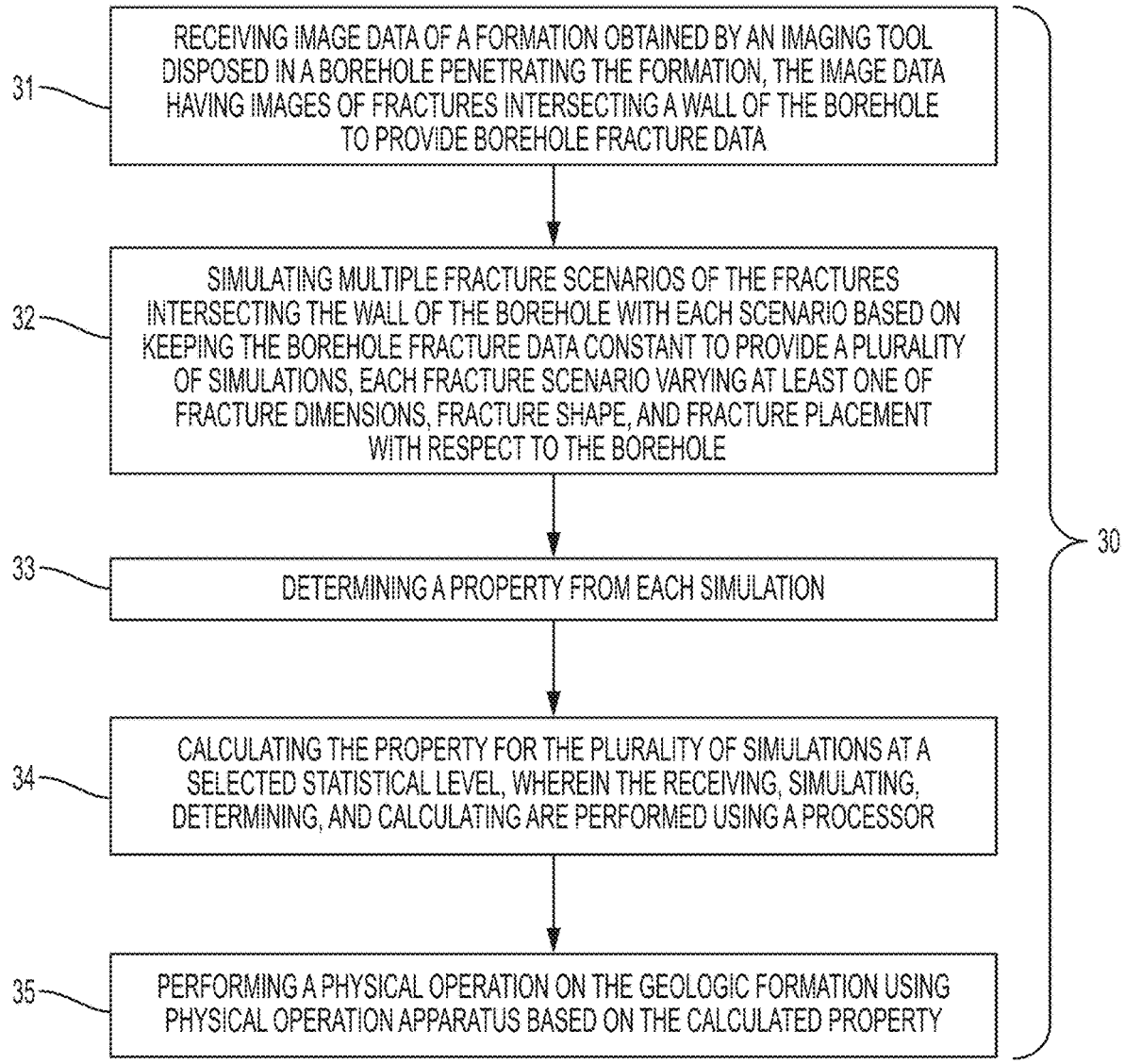
FIG. 3 is a flow chart for a method for performing a physical operation on a geologic formation.
Figure 4:
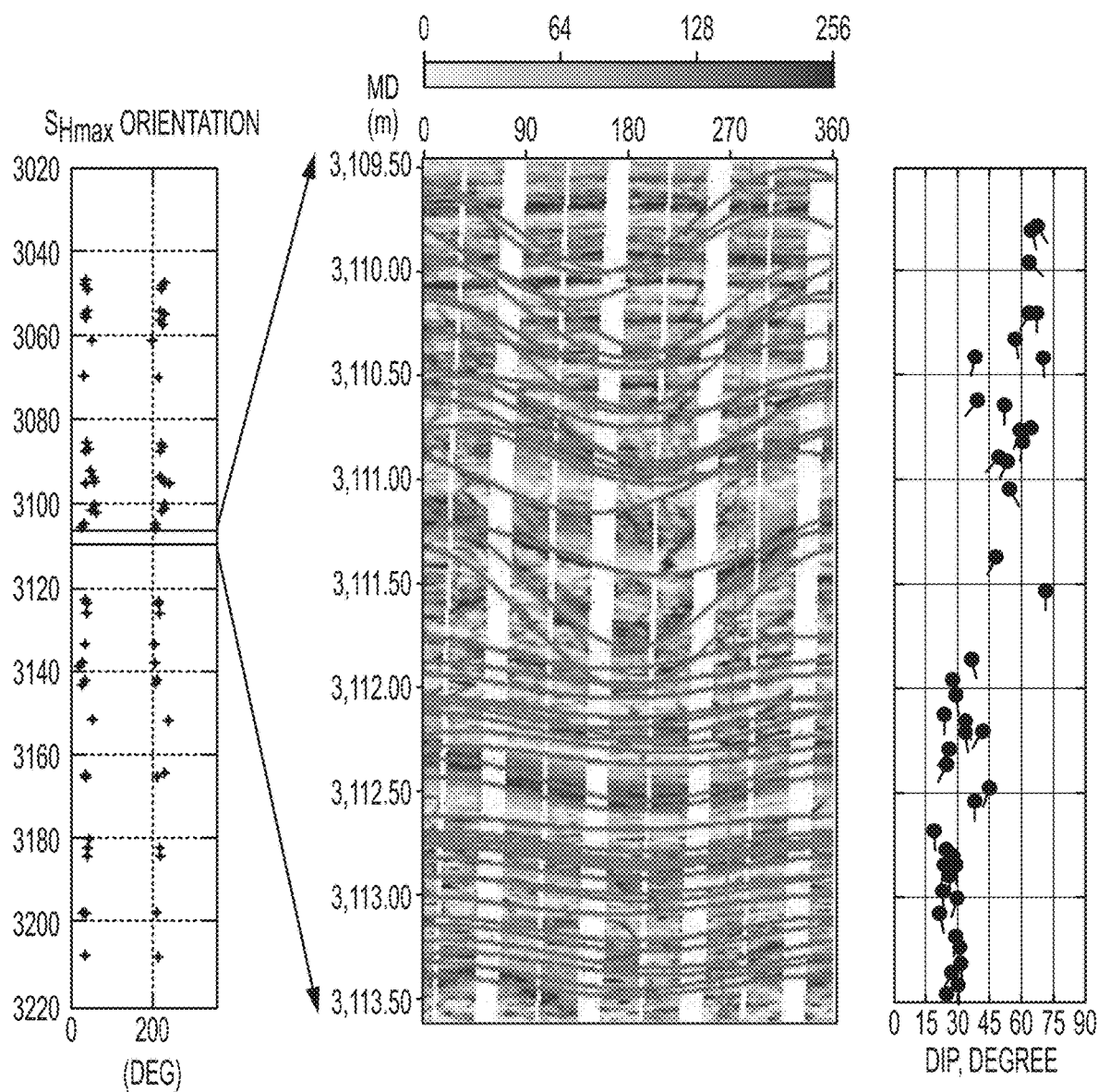
FIG. 4 depicts aspects of borehole image data as published in Paul, Zoback & Hennings, 2009, *Fluid flow in a fractured reservoir using a geomechanically constrained fault-zone-damage model for reservoir simulation*, SPE.

FIG. 3 is a flow chart for a method 30 for performing a physical operation on a geologic formation. Block 31 calls for receiving image data of the formation obtained by an imaging tool disposed in a borehole penetrating the formation, the image data having images of fractures intersecting a wall of the borehole to provide borehole fracture data. The images may be images derived from the borehole fracture data that can be viewed by an analyst or virtual images that are represented as data. Viewable images for example may be graphic representations of resistivity data. The analyst or interpretation specialist may "pick" fractures from an image log of images versus depth. The picking involves (1) locating the location/presence, (2) fitting a sinusoid to the image to determine the orientation of the fracture and (3) assigning a fracture set as well as confidence to the fracture. By this process different sets of fractures can be identified based on their orientation and the one dimension (1D) fracture density (count per length unit) can be determined either for the whole population or per set. For incorporating the fractures into a near-wellbore fracture network for sub-surface modeling or simulation—such as a reservoir simulation—other essential information is required such as (4) fracture apertures, fracture dimensions (5, 6—length and height) and (7) cross cutting relationships to other fractures. These parameters cannot be quantified directly from the interpretation of image logs and, thus, statistical analysis is used to obtain this information. From the image log interpretation one measure that may be used is fracture count per distance or the fracture density in 1D. Segments which have high fracture densities are believed to be more permeable and thus more likely to contribute to the production of hydrocarbons in the well. Based on the fracture density decisions are influenced in respect on where to develop the well, what completions to use and whether stimulation is required to enhance the well-inflow in the section. FIG. 4 presents one example of received image data that contain borehole fracture data. On the right side of the illustration, each circle represents a fracture and corresponding dip angle of the fracture with a line extending from the circle representing the direction of the dip. In the center illustration, the upper fractures are high angle fractures and the lower fractures are low angle fractures.

Figure 5:
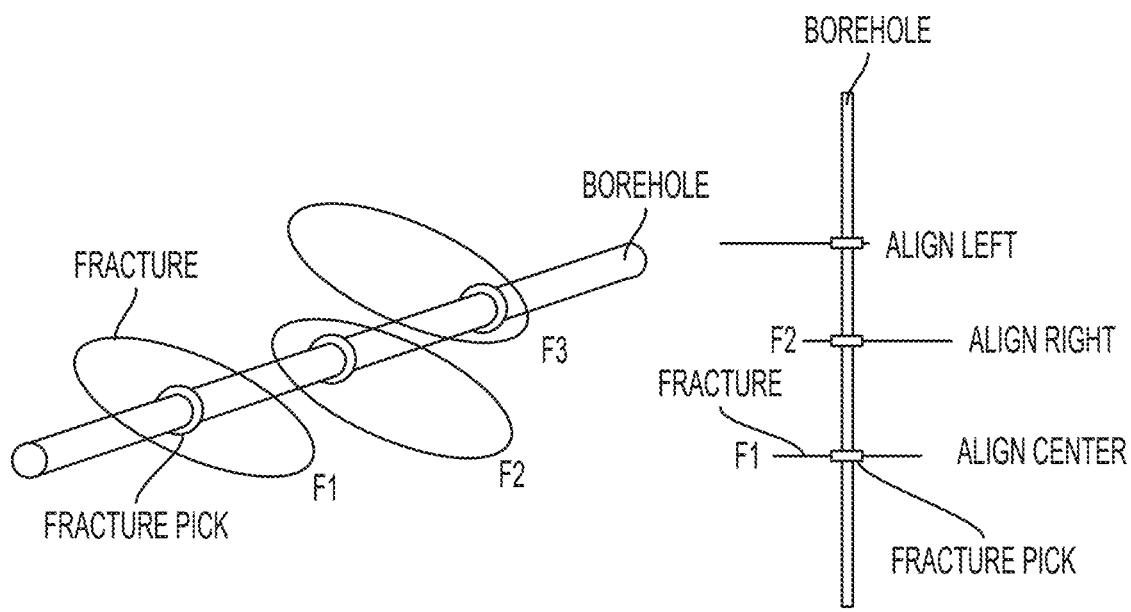
FIG. 5 depicts aspects of placement issues of discrete fractures at fracture picks.

Block 32 call for simulating multiple fracture scenarios of the fractures intersecting the wall of the borehole with each scenario based on keeping the borehole fracture data constant to provide a plurality of simulations, each fracture scenario varying at least one of fracture dimensions, fracture shape, and fracture placement with respect to the borehole. In one or more embodiments, simulating the multiple fracture scenarios involves performing a Monte Carlo method. When having fracture picks along a wellbore, the picks will hold information where a fracture intersects the well bore and with what orientation. It however does not hold information on (1) the size of the fracture and (2) how the fracture is positioned relative to the well bore. FIG. 5 illustrates three equally large fractures in a perspective view (FIG. 5A) as well as a top view (FIG. 5B). F1 is centered, F2 shifted to the right, F3, shifted to the left. With just the pick there is no way to tell where the fracture is penetrated by the borehole 2.

Figure 6:
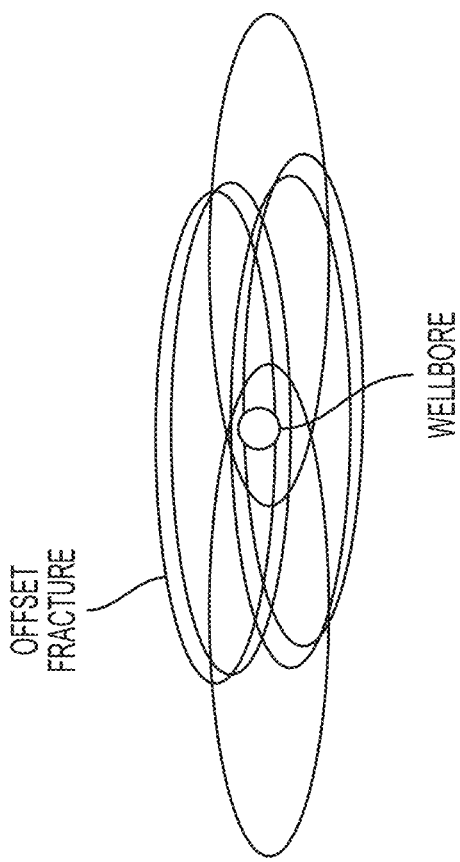
FIG. 6 depicts aspects of multiple elliptical fractures surrounding a well pick.
Figure 6:
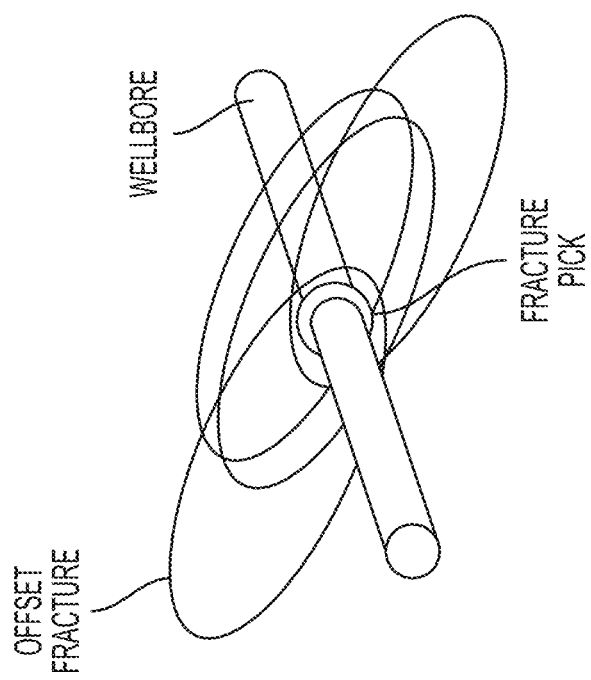
Figure 7A:
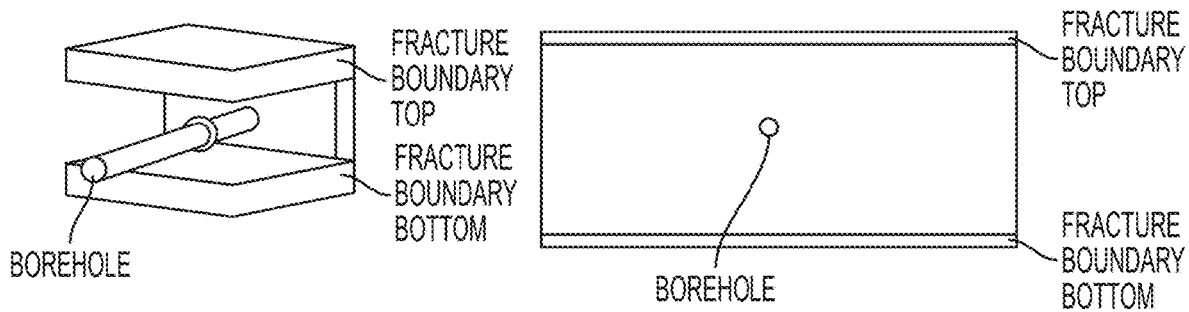
FIGS. 7A-7D, collectively referred to as FIG. 7, depict aspects of constraining a size of fractures in a near-wellbore fracture network model.
Figure 7B:
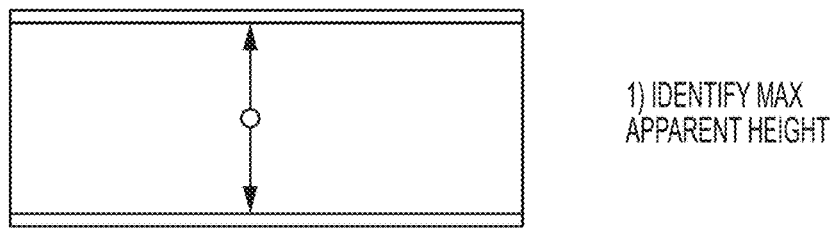
Figure 7C:
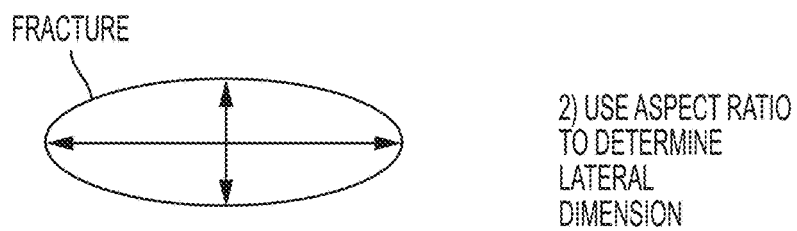
Figure 7D:
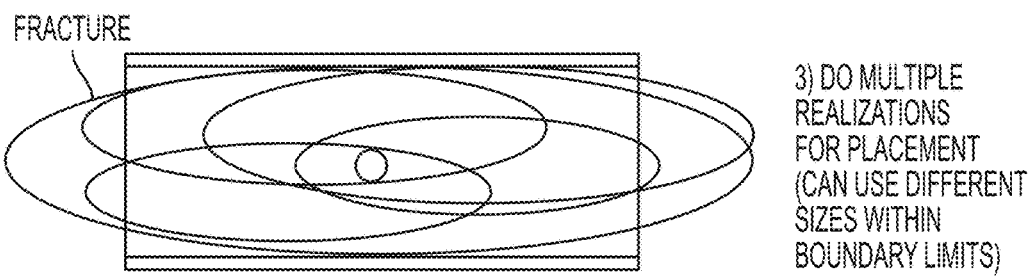

One approach to this problem is to use multiple realizations (i.e., simulations) in placing the fracture in respect to the pick. FIG. 6 illustrates an example of where a number of fractures are placed. These all fulfill the condition that they honor the fracture pick (i.e., keep the borehole fracture data constant) but hold different positions or placements with respect to the borehole. The size of the fractures used in the different realizations is however not constrained in this example. In one or more embodiments, the borehole passes symmetrically through the fracture. In one or more embodiments, the borehole passes asymmetrically through the fracture.

Figure 8A:
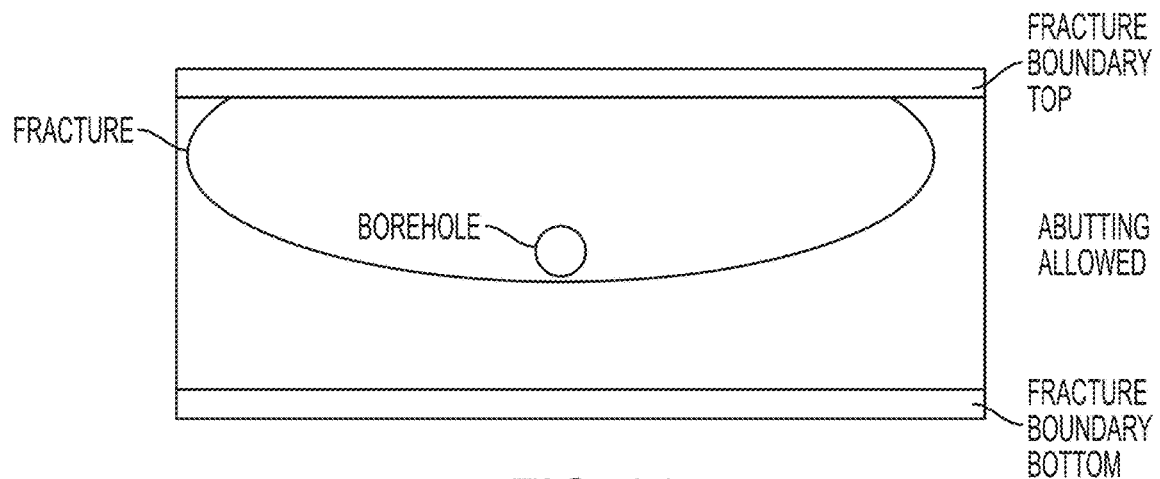
FIGS. 8A and 8B, collectively referred to as FIG. 8, depict aspects of abutting of modeled fractures being allowed and not allowed.
Figure 8B:
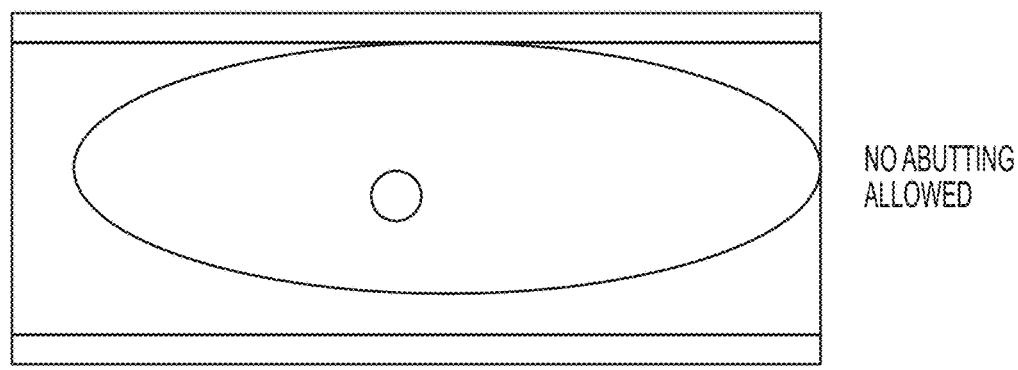

One way to control the sizes and geometry of the fractures is to use geometric as well as statistical constraints. One approach is for a single fracture in illustrated in FIG. 7. Here a profile view shows the wellbore in the center. The constraint for the geometry is given by two bounding horizons (Frac Bound Top and Frac Bound Bottom) which are assumed to confine the fractures. Given the orientation of the fracture and the pick location, the apparent height can be determined. Using a user-defined aspect ratio (optional), the maximum length and height can be calculated. For a user-defined fracture shape, multiple realizations are then carried out placing the fracture center at different locations. While the fracture is shown as an ellipse in FIG. 7, the fracture may have other shapes such as a rectangle in a non-limiting example. Choices have to be made whether abutting is allowed or not. FIG. 8 illustrates cases of abutting being allowed (8A) and not allowed (8B). In the case of abutting, the fracture may be positioned in such a way that it abuts against the confining layer. If no abutting is permitted, then the size of the fracture is put to a hold when the bounding layer is touched. The decision on whether abutting is allowed or not can be made based on other data such as data obtained from rock outcroppings or core samples for example. Alternatively, rather than a bounding layer which is used as a strict confinement, a grid property with a confinement probability could be used. This would allow user-defined case fractures to stretch beyond layers.

The implementation of multiple fractures is more difficult than just focusing on single fractures alone. In one or more embodiments, modeling the population of fractures is performed per fracture set. Based on a user decision, the sequence of the fractures needs to be determined and then these fractures are modelled and placed in one of the fracture sets, which can be modeled in successive order.

Figure 9A:
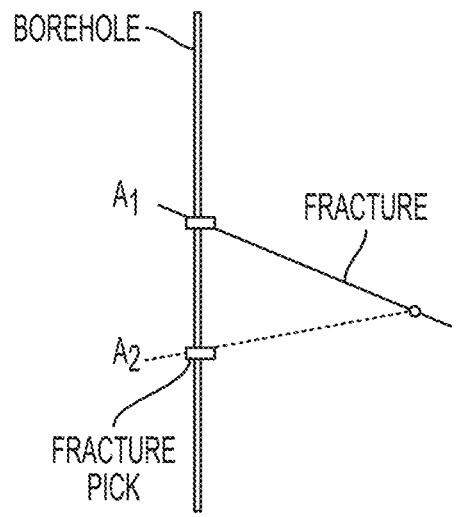
FIGS. 9A and 9B, collectively referred to as FIG. 9, depict aspects of direct placement of fractures versus incremental growth of fractures.
Figure 9B:
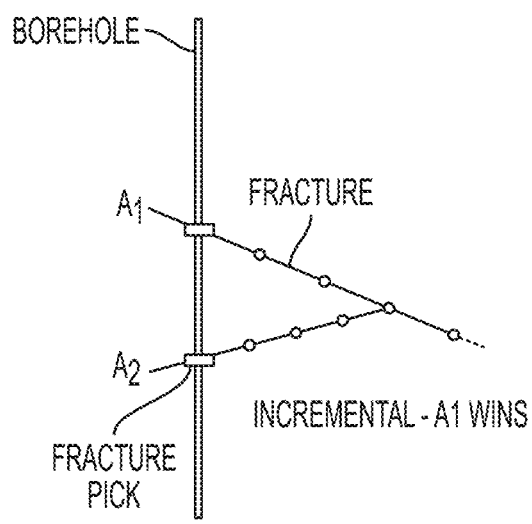
Figure 10A:
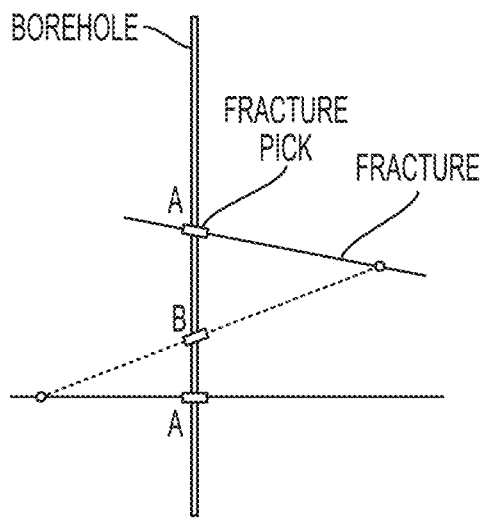
FIGS. 10A-10D, collectively referred to as FIG. 10, depict aspects of abutting and placements of multiple sequential sets of fractures.
Figure 10B:
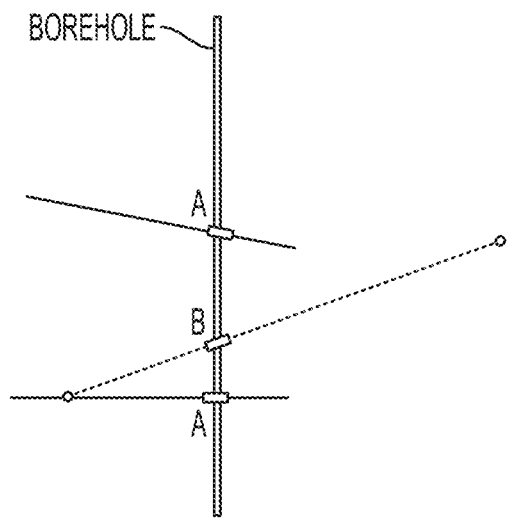
Figure 10C:
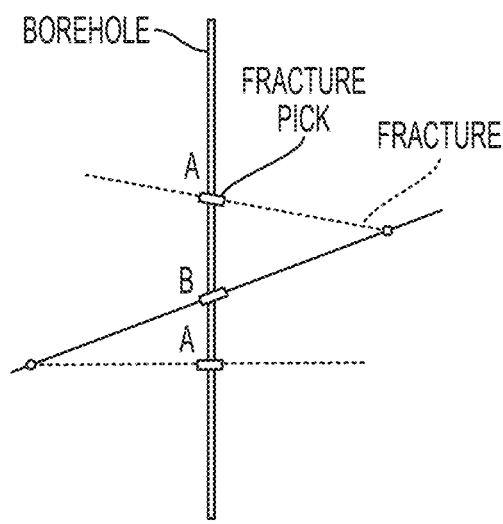
Figure 10D:
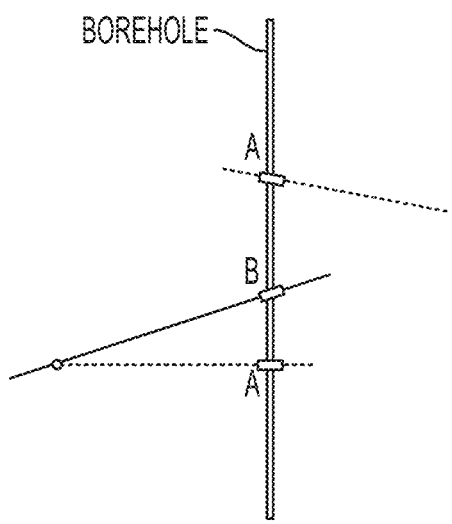

Within a fracture set, the placement of the fractures and the choice on the growth needs to be determined. Here again, multiple possibilities are possible where some of them are illustrated in FIG. 9. Here, two fractures are modelled. In the left scenario (9A) the fractures are placed sequentially. First the fracture for pick A1 is set, then the fracture for pick A2 is placed. In this case, abutting is honored or allowed. An algorithm would need to select randomly which fracture would be drawn first. The right scenario (9B) is based on incremental growth. Not representing or simulating real growth, the fracture geometry of all fractures can be enlarged incrementally. Such a process may be performed in two-dimensions (2D) or three-dimensions (3D) with the added CPU expense.

Once it is decided how to grow/place the fractures while honoring the borehole fracture data, then it is possible to use a sequential placement of fractures in a set and then run the sequential modeling of the sets. This can then produce patterns as illustrated in 2D in FIG. 10. The upper row (10A and 10B) shows two realizations in which the set B abuts against set A, the lower row (10C and 10D) shows the opposite where set A abuts against set B. It should be noted that due to the different placements and sizes of the first generation fracture, the sizes of the second generation may have a much larger variability as they sometimes abut, while in other realizations they do not abut. Due to the large number of possibilities in simulating fractures, various constraints may be used. Constraints may include limiting size of fractures based on layering constraints, density of fracture constraints, and minimum and maximum size of fractures.

The constraints on the placed fractures can be controlled by multiple rules. Next to the abutting, constraints may be placed on the fracture size, the fracture density (cumulative size in a certain g area or volume) a size distribution may be used.

Referring back to FIG. 3, block 33 calls for determining a property from each simulation. Non-limiting embodiments of the property include fracture density and permeability. The permeability may be a function of depth and may be associated with a direction. The property may be determined based on the physical parameters of the fractures in the simulation. For example, the number of fractures per depth interval in a certain direction in the borehole can be counted. In 2D, the number of fractures per unit area intersecting the borehole in a certain direction can be counted. Also, the fracture length per unit area can be calculated in 2D. In 3D, the following calculations can be made: fracture area per unit volume; fracture count per unit volume; fracture volume per unit volume; fracture spacing in different directions (e.g., I, J, K orthogonal directions); and fracture permeability in different directions (e.g., I, J, K orthogonal directions). Using an aspect ratio (with the aperture being a function of fracture length and width), the permeability of the simulated fractures can be determined using basic principles of fluid mechanics based on the fracture dimensions and connections. One non-limiting method is the so-called Oda method, which is a fast analytical way of calculating equivalent permeability. The aspect ratio can be assumed based on prior knowledge or from other data such as data obtained from rock outcroppings or core sampled.

Block 34 calls for calculating the property for the plurality of simulations at a selected statistical level, wherein the receiving, simulating, determining, and calculating are performed using a processor. For example, in one or more embodiments, a 90% confidence level would indicate that 90% of the simulations resulted in a property value that was greater than a reference value, while 10% of those simulations resulted in a property value that was less than the reference value. Other types of statistical levels may also be used such as average value and median value.

Block 35 calls for performing the physical operation on the geologic formation using physical operation apparatus based on the calculated property. Many different types of physical operations may be performed based on the calculated property, which can be directionally dependent or independent. Non-limiting embodiments include drilling a borehole according to a selected trajectory, borehole completion tasks, casing perforation, and formation stimulation such as hydraulic fracturing.

Figure 11:
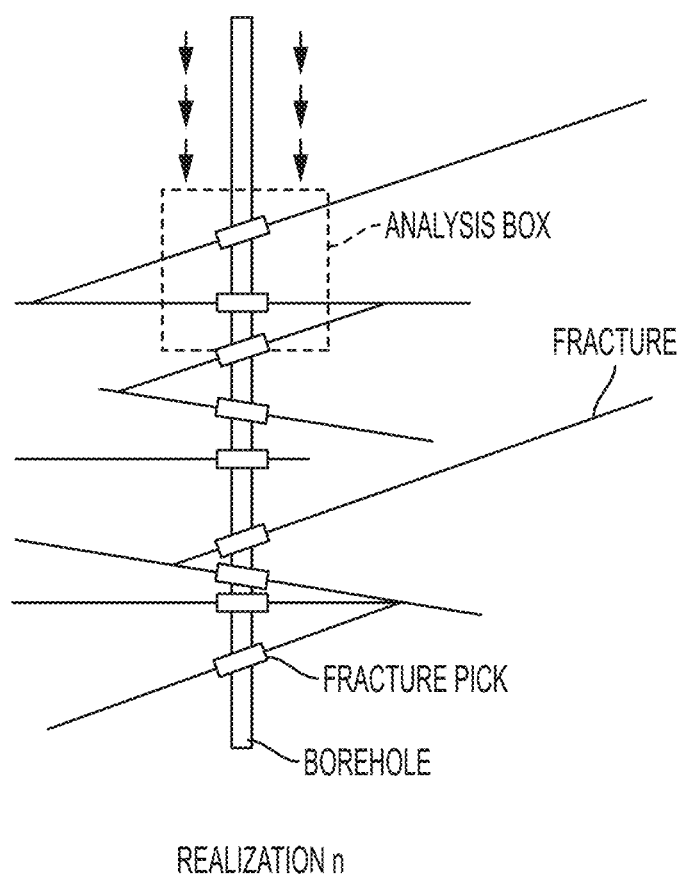

Workflow for performing the simulations is now discussed. In one or more embodiments, simulations are performed for the multitude of fractures surrounding the wellbore. This is done for a plurality of simulations each of which honor the wellbore observations while varying at least one of fracture dimensions, fracture shape and fracture placement. Every simulation can be analyzed with the use of defined volumes that surround the wellbore. The volumes are obtained by sliding a single analysis volume incrementally along the wellbore as illustrated in FIG. 11. For teaching purposes, the volumes are rectangular boxes as illustrated in FIG. 12 showing the possible alignments in respect to the wellbore.

While the boxes are shown as not overlapping for illustration purposes, the boxes may be overlapped to provide complete coverage for the simulations. FIG. 12A illustrates a Type 0 arrangement in which the boxes are oriented using the azimuth and dip of the wellbore where each box is represented. FIG. 12B illustrates a Type 1 arrangement in which the boxes have a horizontal alignment and are aligned with the azimuth of the wellbore where each box is represented. FIG. 12C illustrates a Type 2 arrangement in which all the boxes are aligned horizontally and to the North. In one or more embodiments, each or the boxes is 10 meters by 10 meters by 10 meters. Each simulation is analyzed within the plurality of the boxes, calculating information such as—but not limited to—fracture count per unit volume, fracture area per unit volume, fracture volume per unit volume, fracture spacing in UK direction, fracture permeability in UK direction with UK being the principle directions of the boxes. The plurality of fracture simulations may provide a plurality of results per box which can be analyzed with statistical methods.

In addition to the benefits of the disclosure discussed above, properties estimated using the near-wellbore fracture can be used to assist in interpretation of microseismic data that may include microseismic event amplitudes and locations.

Set forth below are some embodiments of the foregoing disclosure:

Embodiment 1

A method for performing a physical operation on a geologic formation, the method comprising: receiving image data of the formation obtained by an imaging tool disposed in a borehole penetrating the formation, the image data comprising images of fractures intersecting a wall of the borehole to provide borehole fracture data; simulating multiple fracture scenarios of the fractures intersecting the wall of the borehole with each scenario based on keeping the borehole fracture data constant to provide a plurality of simulations, each fracture scenario varying at least one of fracture dimensions, fracture shape, and fracture placement with respect to the borehole; determining a property from each simulation; calculating the property for the plurality of simulations at a selected statistical level, wherein the receiving, simulating, determining, and calculating are performed using a processor; and performing the physical operation on the geologic formation using physical operation apparatus based on the calculated property.

Embodiment 2

The method according to any prior embodiment, wherein the borehole fracture data comprises depth in borehole of the fractures and orientation of fractures comprising dip angle and direction of dip.

Embodiment 3

The method according to any prior embodiment, wherein simulating, determining, and calculating comprises performing a Monte Carlo method.

Embodiment 4

The method according to any prior embodiment, wherein a first fracture is allowed to abut a second fracture.

Embodiment 5

The method according to any prior embodiment, wherein a first fracture is not allowed to abut a second fracture.

Embodiment 6

The method according to any prior embodiment, wherein simulating comprises placing a fracture such that the borehole passes through a center of the fracture.

Embodiment 7

The method according to any prior embodiment, wherein simulating comprises placing a fracture such that the borehole passes through offset of a center of the fracture.

Embodiment 8

The method according to any prior embodiment, wherein simulating comprises not allowing a fracture to extend beyond a boundary layer.

Embodiment 9

The method according to any prior embodiment, wherein the fracture is confined within two boundary layers.

Embodiment 10

The method according to any prior embodiment, wherein the property is a function of depth and comprises at least one of: fracture area/unit volume; fracture count/unit volume; fracture volume/unit volume fracture spacing in different orthogonal directions; and fracture permeability in different orthogonal directions.

Embodiment 11

The method according to any prior embodiment, wherein the physical operation comprises perforating a casing lining the borehole in a selected depth interval where the selected depth interval is based on the calculated property.

Embodiment 12

The method according to any prior embodiment, wherein the physical operation comprises hydraulically fracturing the geologic formation in a selected depth interval where the selected depth interval is based on the calculated property.

Embodiment 13

The method according to any prior embodiment, wherein the physical operation comprises drilling a borehole with a selected trajectory where the selected trajectory is based on the calculated property.

Embodiment 14

The method according to any prior embodiment, wherein the imaging tool is at least one of an electrical resistivity or conductivity tool and an acoustic tool.

Embodiment 15

The method according to any prior embodiment, wherein simulating comprises identifying a plurality of virtual volumes surrounding the borehole, simulating multiple fracture scenarios of the fractures intersecting the wall of the borehole within each identified volume, and using the simulations of the multiple fracture scenarios for the identified volumes for the determining and the calculating.

Embodiment 16

The method according to any prior embodiment, wherein the each volume overlaps an adjacent volume.

Embodiment 17

A method for drilling a first borehole in a geologic formation, the method comprising: receiving image data of the formation obtained by an imaging tool disposed in a second borehole penetrating the formation, the image data comprising images of fractures intersecting a wall of the borehole to provide borehole fracture data; simulating multiple fracture scenarios of the fractures intersecting the wall of the second borehole with each scenario based on keeping the borehole fracture data constant to provide a plurality of simulations, each fracture scenario varying at least one of fracture dimensions, fracture shape, and fracture placement with respect to the borehole; determining a directional permeability as a function of depth from each simulation; calculating the directional permeability as a function of depth for the plurality of simulations at a selected statistical level, wherein the receiving, simulating, determining, and calculating are performed using a processor; and drilling the first borehole according to a selected trajectory based on the calculated directional permeability as a function of depth, wherein a value of the directional permeability at a selected depth interval meets or exceeds a threshold value.

Embodiment 18

A method for hydraulically fracturing a geologic formation, the method comprising: receiving image data of the formation obtained by an imaging tool disposed in a borehole penetrating the formation, the image data comprising images of fractures intersecting a wall of the borehole to provide borehole fracture data; simulating multiple fracture scenarios of the fractures intersecting the wall of the borehole with each scenario based on keeping the borehole fracture data constant to provide a plurality of simulations, each fracture scenario varying at least one of fracture dimensions, fracture shape, and fracture placement with respect to the borehole; determining a permeability as a function of depth from each simulation; calculating the permeability as a function of depth for the plurality of simulations at a selected statistical level, wherein the receiving, simulating, determining, and calculating are performed using a processor; and hydraulically fracturing the formation in a selected depth interval based on the calculated permeability as a function of depth, wherein a value of the permeability as a function of depth is less than a threshold value.

In support of the teachings herein, various analysis components may be used, including a digital and/or an analog system. For example, the downhole sensor 11, the downhole electronics 18, the downhole tool 28 and/or the surface computer processing system 12, 22 may include digital and/or analog systems. The system may have components such as a processor, storage media, memory, input, output, communications link (wired, wireless, optical or other), user interfaces (e.g., a display or printer), software programs, signal processors (digital or analog) and other such components (such as resistors, capacitors, inductors and others) to provide for operation and analyses of the apparatus and methods disclosed herein in any of several manners well-appreciated in the art. It is considered that these teachings may be, but need not be, implemented in conjunction with a set of computer executable instructions stored on a non-transitory computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user or other such personnel, in addition to the functions described in this disclosure.

Further, various other components may be included and called upon for providing for aspects of the teachings herein. For example, a power supply (e.g., at least one of a generator, a remote supply and a battery, magnet, electromagnet, sensor, electrode, transmitter, receiver, transceiver, antenna, controller, optical unit, electrical unit or electromechanical unit may be included in support of the various aspects discussed herein or in support of other functions beyond this disclosure.

The term "carrier" as used herein means any device, device component, combination of devices, media and/or member that may be used to convey, house, support or otherwise facilitate the use of another device, device component, combination of devices, media and/or member. Other exemplary non-limiting carriers include drill strings of the coiled tube type, of the jointed pipe type and any combination or portion thereof. Other carrier examples include casing pipes, wirelines, wireline sondes, slickline sondes, drop shots, bottom-hole-assemblies, drill string inserts, modules, internal housings and substrate portions thereof.

Elements of the embodiments have been introduced with either the articles "a" or "an." The articles are intended to mean that there are one or more of the elements. The terms "including" and "having" and the like are intended to be inclusive such that there may be additional elements other than the elements listed. The conjunction "or" when used with a list of at least two terms is intended to mean any term or combination of terms. The term "configured" relates one or more structural limitations of a device that are required for the device to perform the function or operation for which the device is configured. The terms "first" and "second" are used to distinguish different elements and do not denote any particular order.

The flow diagram depicted herein is just an example. There may be many variations to this diagram or the steps (or operations) described therein without departing from the spirit of the invention. For instance, the steps may be performed in a differing order, or steps may be added, deleted or modified. All of these variations are considered a part of the claimed invention.

The disclosure illustratively disclosed herein may lie practiced in the absence of any element which is not specifically disclosed herein.

While one or more embodiments have been shown and described, modifications and substitutions may be made thereto without departing from the spirit and scope of the invention. Accordingly, it is to be understood that the present invention has been described by way of illustrations and not limitation.

It will be recognized that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood that various changes may be made and equivalents may be substituted for elements thereof without departing from the scope of the invention. In addition, many modifications will be appreciated to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the claims.

What is claimed is:

1. A method for performing a physical operation on a geologic formation, the method comprising:
receiving image data of the formation obtained by an imaging tool disposed in a single borehole penetrating the formation, the image data comprising images of fractures intersecting a wall of the single borehole to provide borehole image fracture data;
simulating multiple fracture scenarios of the fractures intersecting the wall of the single borehole with each scenario based on keeping the borehole image fracture data constant to provide a plurality of simulations, each fracture scenario varying non-borehole image fracture data comprising a fracture placement with respect to the single borehole, wherein the multiple fracture scenarios comprise a plurality of first fracture scenarios, each first fracture scenario representing a fracture intersecting the wall of the single borehole and having a center that is offset from the single borehole, each first fracture scenario having at least one of an offset distance or offset direction of the center that is different from a corresponding offset distance or offset direction represented in any of the other first fracture scenarios, at least one first fracture scenario having a first fracture and a second fracture identified in the borehole image fracture data with the first fracture having a first fracture dip angle that is different from a second fracture dip angle of the second fracture, wherein the varying non-borehole image data comprises extending the first fracture along the first fracture dip angle and then extending the second fracture along the second fracture dip angle until the second fracture intersects the first fracture;
determining a property value from each simulation in the plurality of simulations;
calculating a representative property value for the plurality of simulations using the determined property value from each simulation in the plurality of simulations at a selected statistical level applied to the property values determined from the plurality of simulations, wherein the receiving, simulating, determining, and calculating are performed using a processor; and performing the physical operation on the geologic formation using physical operation apparatus based on the representative property value.

2. The method according to claim 1, wherein the borehole fracture data comprises depth in borehole of the fractures and orientation of fractures comprising dip angle and direction of dip.

3. The method according to claim 1, wherein simulating, determining, and calculating comprises performing a Monte Carlo method.

4. The method according to claim 1, wherein a first fracture is allowed to abut a second fracture.

5. The method according to claim 1, wherein a first fracture is not allowed to abut a second fracture.

6. The method according to claim 1, wherein the simulating comprises placing a fracture such that the borehole passes through a center of the fracture.

7. The method according to claim 1, wherein the simulating comprises placing a fracture such that the borehole passes through offset of a center of the fracture.

8. The method according to claim 1, wherein the simulating comprises not allowing a fracture to extend beyond a confining layer of the formation.

9. The method according to claim 8, wherein the fracture is confined within two confining layers of the formation.

10. The method according to claim 1, wherein the property is a function of depth and comprises at least one of: fracture area/unit volume; fracture count/unit volume; fracture volume/unit volume fracture spacing in different orthogonal directions; and fracture permeability in different orthogonal directions.

11. The method according to claim 1, wherein the physical operation comprises perforating a casing lining the borehole in a selected depth interval where the selected depth interval is based on the calculated property.

12. The method according to claim 1, wherein the physical operation comprises hydraulically fracturing the geologic formation in a selected depth interval where the selected depth interval is based on the calculated property.

13. The method according to claim 1, wherein the physical operation comprises drilling a borehole with a selected trajectory where the selected trajectory is based on the calculated property.

14. The method according to claim 1, wherein the imaging tool is at least one of an electrical resistivity or conductivity tool and an acoustic tool.

15. The method according to claim 1, wherein the borehole comprises a non-vertical section and wherein the simulating comprises identifying a plurality of defined volumes surrounding the borehole, simulating the multiple fracture scenarios of the fractures intersecting the wall of the borehole within each identified defined volume, and using the simulations of the multiple fracture scenarios for the identified defined volumes for the determining and the calculating, the plurality of defined volumes being aligned in accordance with at least one of (i) azimuth and dip of trajectory of the borehole, (ii) azimuth of trajectory of the borehole and being horizontal, or (iii) a selected constant azimuth and being horizontal.

16. The method according to claim 15, wherein the each defined volume overlaps an adjacent defined volume.

17. The method according to claim 1, wherein the each fracture scenario varying non-borehole image fracture data further comprises at least one of fracture dimensions or fracture shape.

18. The method according to claim 1, wherein the multiple fracture scenarios include a fracture scenario in which the center is within the borehole.

19. A method for drilling a first borehole in a geologic formation, the method comprising:
receiving image data of the formation obtained by an imaging tool disposed in a single second borehole penetrating the formation, the image data comprising images of fractures intersecting a wall of the single second borehole to provide borehole image fracture data;
simulating multiple fracture scenarios of the fractures intersecting the wall of the single second borehole with each scenario based on keeping the borehole image fracture data constant to provide a plurality of simulations, each fracture scenario varying non-borehole image data comprising a fracture placement with respect to the single second borehole, wherein the multiple fracture scenarios comprise a plurality of first fracture scenarios, each first fracture scenario representing a fracture intersecting the wall of the single second borehole and having a center that is offset from the single second borehole, each first fracture scenario having at least one of an offset distance or offset direction of the center that is different from a corresponding offset distance or offset direction represented in any of the other first fracture scenarios, at least one first fracture scenario having a first fracture and a second fracture identified in the borehole image fracture data with the first fracture having a first fracture dip angle that is different from a second fracture dip angle of the second fracture, wherein the varying non-borehole image data comprises extending the first fracture along the first fracture dip angle and then extending the second fracture along the second fracture dip angle until the second fracture intersects the first fracture;
determining a directional permeability value as a function of depth from each simulation in the plurality of simulations;
calculating a representative directional permeability value as a function of depth for the plurality of simulations using the determined directional permeability value from each simulation in the plurality of simulations at a selected statistical level applied to the directional permeability values determined from the plurality of simulations, wherein the receiving, simulating, determining, and calculating are performed using a processor; and
drilling the first borehole according to a selected trajectory based on the calculated representative directional permeability value as a function of depth, wherein the representative directional permeability value at a selected depth interval meets or exceeds a threshold value.

20. A method for hydraulically fracturing a geologic formation, the method comprising:
receiving image data of the formation obtained by an imaging tool disposed in a single borehole penetrating the formation, the image data comprising images of fractures intersecting a wall of the single borehole to provide borehole image fracture data;
simulating multiple fracture scenarios of the fractures intersecting the wall of the single borehole with each scenario based on keeping the borehole image fracture data constant to provide a plurality of simulations, each fracture scenario varying non-borehole image fracture data comprising a fracture placement with respect to the single borehole, wherein the multiple fracture scenarios comprise a plurality of first fracture scenarios, each first fracture scenario representing a fracture intersecting the wall of the single borehole and having a center that is offset from the single borehole, each first fracture scenario having at least one of an offset distance or offset direction of the center that is different from a corresponding offset distance or offset direction represented in any of the other first fracture scenarios, at least one first fracture scenario having a first fracture and a second fracture identified in the borehole image fracture data with the first fracture having a first fracture dip angle that is different from a second fracture dip angle of the second fracture, wherein the varying non-borehole image data comprises extending the first fracture along the first fracture dip angle and then extending the second fracture along the second fracture dip angle until the second fracture intersects the first fracture;

determining a permeability value as a function of depth from each simulation in the plurality of simulations;

calculating a representative permeability value as a function of depth for the plurality of simulations using the determined permeability value as a function of depth from each simulation in the plurality of simulations at a selected statistical level applied to the permeability values as a function of depth determined from the plurality of simulations, wherein the receiving, simulating, determining, and calculating are performed using a processor; and hydraulically fracturing the formation in a selected depth interval based on the calculated representative permeability value as a function of depth, wherein the representative permeability value as a function of depth is less than a threshold value.

* * * * *